(12) United States Patent
Nakano

(10) Patent No.: US 8,765,868 B2
(45) Date of Patent: Jul. 1, 2014

(54) RESIN COMPOSITION FOR INSULATING FILM OR SURFACE-PROTECTIVE FILM OF ELECTRONIC COMPONENTS, METHOD FOR PRODUCING PATTERN-CURED FILM AND ELECTRONIC COMPONENTS

(75) Inventor: Hajime Nakano, Hitachi (JP)

(73) Assignee: Hitachi Chemical DuPont Microsystems, Ltd., Tokyo (JP)

( * ) Notice: Subject to any disclaimer, the term of this patent is extended or adjusted under 35 U.S.C. 154(b) by 451 days.

(21) Appl. No.: 12/771,756

(22) Filed: Apr. 30, 2010

(65) Prior Publication Data

US 2011/0027544 A1 Feb. 3, 2011

(30) Foreign Application Priority Data

Jul. 31, 2009 (JP) .................. 2009-179058

(51) Int. Cl.
  C08G 18/42 (2006.01)
  C08G 18/46 (2006.01)
  B44C 1/00 (2006.01)
  G03F 7/00 (2006.01)

(52) U.S. Cl.
  USPC ............. 524/539; 428/195.1; 430/270.1; 430/325

(58) Field of Classification Search
  USPC ............. 524/101, 539; 428/195.1; 430/270.1, 430/325
  See application file for complete search history.

(56) References Cited

U.S. PATENT DOCUMENTS

| | | | |
|---|---|---|---|
| 6,436,593 B1 * | 8/2002 | Minegishi et al. ............... | 430/18 |
| 2004/0029045 A1 | 2/2004 | Nunomura et al. | |
| 2007/0072122 A1 | 3/2007 | Nunomura et al. | |
| 2011/0076458 A1 | 3/2011 | Nunomura et al. | |

FOREIGN PATENT DOCUMENTS

| | | |
|---|---|---|
| JP | 54-109828 | 8/1979 |
| JP | 1-40862 | 8/1989 |
| JP | 04-204945 | 7/1992 |
| JP | 2000-187321 | 7/2000 |
| JP | 2001-042527 A | 2/2001 |
| JP | 2001-174996 A | 6/2001 |
| JP | 2003-337415 A | 11/2003 |
| JP | 2006-071663 | 3/2006 |
| JP | 2007-016214 | 1/2007 |

OTHER PUBLICATIONS

Office Action issued in corresponding Japanese application 2010-100736 on Jul. 2, 2013 (no translation available, submitted for certification).

* cited by examiner

Primary Examiner — Kriellion Sanders
(74) Attorney, Agent, or Firm — Griffin & Szipl, P.C.

(57) ABSTRACT

A resin composition includes: (A) a polymer having a structural unit shown by the formula (I), and an acidic functional group or a group derived therefrom at both of the terminals;

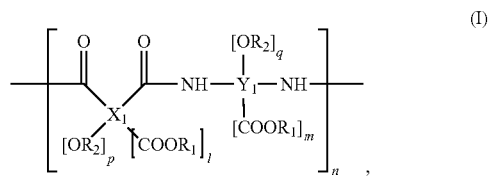

wherein $X_1$ is a di- to octa-valent organic group, $Y_1$ is a di- to octa-valent organic group, $R_1$ is a hydrogen atom or an organic group having 1 to 20 carbon atoms, $R_2$ is a hydrogen atom or a monovalent organic group, when plural $R_1$s or $R_2$s exist, the plural $R_1$s or $R_2$s may be the same or different, p and q are independently an integer of 0 to 4, l and m are independently an integer of 0 to 2, and n is an integer of 2 or more indicating the number of structural units; (B) a solvent; and (C) a compound shown by formula (II)

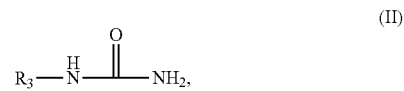

wherein $R_3$ is a monovalent organic group.

12 Claims, 2 Drawing Sheets

RESIN COMPOSITION FOR INSULATING FILM OR SURFACE-PROTECTIVE FILM OF ELECTRONIC COMPONENTS, METHOD FOR PRODUCING PATTERN-CURED FILM AND ELECTRONIC COMPONENTS

This application claims priority from Japanese Patent Application No. 2009-179058, filed Jul. 31, 2009, the entire disclosure of which is incorporated herein by reference.

TECHNICAL FIELD

The invention relates to a resin composition for an insulating film or surface protection film of an electronic part, a method of producing a patterned hardened film, and an electronic part. In particular, it relates to a resin composition for an insulating film or surface protection film of an electronic part having heat resistance, a method of producing a relief pattern by using the resin composition, and electronic parts having the relief pattern as a surface protection film, an interlayer insulating film, etc.

BACKGROUND ART

Polyimide resins have excellent heat resistance so that they are widely used in the field of semi-conductor devices, etc. Polyimide resins are particularly used as an interlayer insulating film, and a surface protection film (buffer coating) which is provided between a sealant and a semi-conductor chip.

Here, the surface protection film is a film which prevents an aluminum thin film circuit and an oxidized film prepared in the previous step from damage during work of the post steps, or from occurrence of cracks due to the difference in the thermal expansion coefficient between a sealant and silicon after mounting a semi-conductor chip. In particular, the surface protection film formed of a polyimide resin attracts attention because of its protective performance against radiation due to high α-ray stopping power, in addition that it protects chips from external damages as mentioned above. Further, polyimide resins attract attention as a tool capable of being simply and assuredly patterned.

Recently, in order to shorten the process for production of a semi-conductor, photo-sensitive polyimides are becoming mainstream from which a relief pattern can be easily formed by a method of adding a compound having a photo-sensitive group to acidic functional groups of a polyimide precursor or mixing the compound to the polyimide precursor to give photo-sensitivity to the polyimide resin, followed by coating, light exposure and development (for example, JP-A-S54-109828 and JP-A-H04-204945).

Recently, from the viewpoint of material costs or environmental protection, there is an increasing demand for development using an alkaline aqueous solution. In this context, a photo-sensitive resin using a polybenzoxazole precursor having an acidic functional group as the base resin or the like are now proposed for an interlayer insulating film or a surface protection film (buffer coating) (for example, JP-B-H01-40862).

However, in the conventional polyimide resins and polybenzoxazole resins, there is a problem that when a relief pattern formed after development is subjected to the final heating step, the film melts so that the size of an opening pattern becomes smaller or the opening pattern disappears (hereinafter referred to as "melt"). This phenomenon occurs because a polyimide precursor or a polybenzoxazole precursor is heated at the final heating step at a temperature higher than the glass transition point thereof.

Namely, in the case where, for example, a polyimide precursor vanish or a polybenzoxazole precursor vanish is applied on a substrate, a relief pattern is formed and finally heated, dehydration ring closure reaction of the precursor is in progress during stepwise rising temperature at the final heating step, so that when the resin film is heated at a temperature higher than the glass transition point, melt of the relief pattern occurs. As a result, various problems such as no desired relief pattern being obtained have been taken place.

As a solution for the above-mentioned problems, a method wherein a cross-linking component is added to a polyimide precursor vanish or a polybenzoxazole precursor vanish is proposed (JP-A-2007-16214). However, by this method, the cross-linking component added may sublime at the time of heating. Further, when heated at a temperature higher than the final heating step at a step after the final heating step, a gas component generates due to decomposition of the cross-linking component. The gas component may cause various problems such as contamination of the metal surface of the opening, crack occurrence of the sealant and breaking of wirings.

In order to improve adhesiveness between the insulating film or the surface protection film and the substrate on which this films are formed, which is made of silicon, various metals, or the like at the time of forming a relief pattern and after the final heating step, an organic silicon compound is used (JP-A-2000-187321, JP-A-2006-071663, etc.). However, these techniques disclosed in these references are not techniques capable of dissolving the problems other than improvement of adhesiveness, such as the melt of the relief pattern.

SUMMARY OF THE INVENTION

Problems to be Solved by the Invention

An object of the above-mentioned invention is to provide a resin composition capable of forming an interlayer insulating film or a surface protection film without occurrence of melt at the final heating step and with smaller sublimation of the cross-linking component and the like, and with smaller generation of gas component at the heating after the final heating step.

Means for Solving the Problems

In view of the circumstances, the inventors found as a result of extensive studies that the above-mentioned various problems could be dissolved by an addition of a specific compound (C) to a resin composition comprising a polymer (A) having an acidic functional group or a group derived therefrom at both of the terminals and a solvent (B).

According to a first embodiment of the invention, the following resin composition, etc. are provided: a resin composition for an insulating film or a surface protection film of an electronic part, wherein the resin composition includes:

(A) a polymer which has a structural unit shown by the following formula (I), and an acidic functional group or a group derived therefrom at both of the terminals;

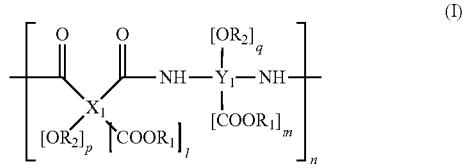

wherein $X_1$ is a di- to octa-valent organic group, $Y_1$ is a di- to octa-valent organic group, $R_1$ is a hydrogen atom or an organic group having 1 to 20 carbon atoms, $R_2$ is a hydrogen atom or a monovalent organic group, when plural $R_1$s or $R_2$s exist, the plural $R_1$s or $R_2$s may be the same or different, p and q are independently an integer of 0 to 4, l and m are independently an integer of 0 to 2, and n is an integer of 2 or more which indicates the number of the structural units;

(B) a solvent; and
(C) a compound shown by the following formula (II)

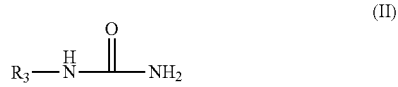

wherein $R_3$ is a monovalent organic group. In accordance with a second embodiment of the invention, the first embodiment is modified so that it further includes: (D) a compound which generates an acid by light. In accordance with a third embodiment of the invention, the second embodiment is modified so that the component (D) is an o-quinonediazide compound. In accordance with a fourth embodiment of the invention, the first embodiment, the second embodiment, and the third embodiment are further modified so that $R_3$ in the formula (II) is a monovalent organic group containing an alkoxysilyl group or an ethenyl group. In accordance with a fifth embodiment of the present invention, the first embodiment, the second embodiment, the third embodiment and the fourth embodiment are further modified so that the component (A) is a polyimide precursor or a polybenzoxazole precursor. In accordance with a sixth embodiment of the present invention, the first embodiment, the second embodiment, the third embodiment and the fourth embodiment are further modified so that the component (A) is a polyimide precursor wherein in the formula (I), p is 0, q is 2, l is 2 and m is 0, and both of the terminals are a carboxy group or a phenolic hydroxy group. In accordance with a seventh embodiment of the present invention, the first embodiment, the second embodiment, the third embodiment and the fourth embodiment are further modified so that the component (A) is a polybenzoxazole precursor wherein in the formula (I), p is 0, q is 2, l is 0 and m is 0, and both of the terminals are a carboxy group or a phenolic hydroxy group. In accordance with an eighth embodiment of the present invention, a method of producing a patterned hardened film is provided, wherein the method includes the steps of: (a) applying the resin composition according to any one of the first embodiment, the second embodiment, the third embodiment, the fourth embodiment, the fifth embodiment, the sixth embodiment, and the seventh embodiment on a supporting substrate, followed by drying to form a resin film; (b) exposing the resin film to light to have a prescribed pattern; (c) developing the resin film after the exposure with an alkaline aqueous solution to obtain a patterned resin film; and (d) heating the patterned resin film. In accordance with a ninth embodiment of the present invention, a hardened film is obtained by hardening the resin composition according to any one of the first embodiment, the second embodiment, the third embodiment, the fourth embodiment, the fifth embodiment, the sixth embodiment, and the seventh embodiment. In accordance with a tenth embodiment of the present invention, and electronic part is provided that includes the hardened film according to the ninth embodiment as an insulating film or a surface protection film.

Effect of the Invention

According to the invention, a resin composition can be provided which can form an interlayer insulating film or a surface protection film without melting at the time of final heating step and with small sublimation of a cross-linking component, etc. and small generation of gas components during heating after the final heating step.

MODE FOR CARRYING OUT THE INVENTION

Figure 1:
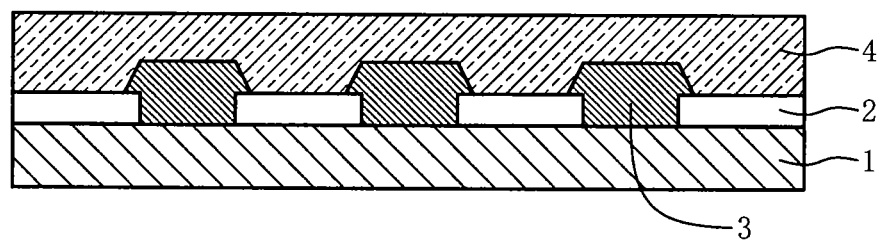
FIG. 1 is a schematic cross-sectional view which explains a production process of a semi-conductor device having a multilayer wiring structure according to one embodiment of the invention, which shows the first step.
Figure 2:
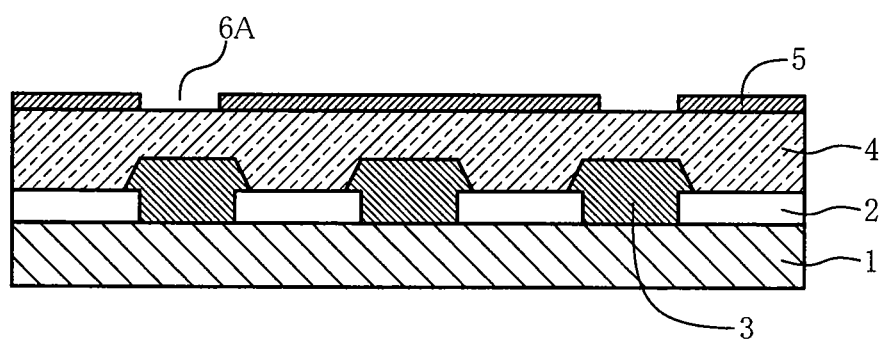
FIG. 2 is a schematic cross-sectional view which explains a production process of a semi-conductor device having a multilayer wiring structure according to one embodiment of the invention, which shows the second step.
Figure 3:
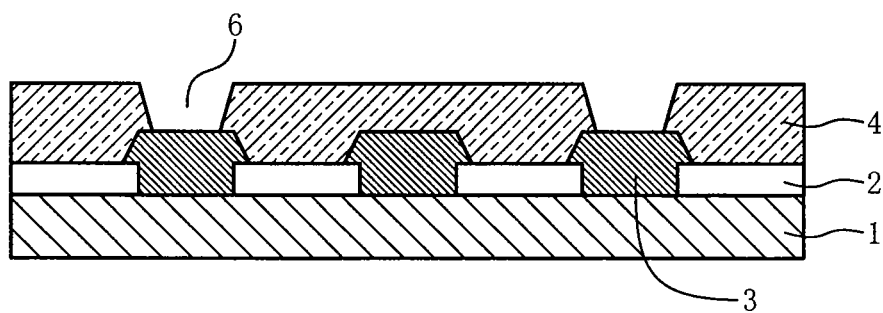
FIG. 3 is a schematic cross-sectional view which explains a production process of a semi-conductor device having a multilayer wiring structure according to one embodiment of the invention, which shows the third step.

The resin composition for an insulating film or a surface protection film of an electronic part of the invention (hereinafter referred to simply as the resin composition) comprises:

(A) a polymer which has a structural unit shown by the following formula (I) and an acidic functional group or a group derived therefrom at both of the terminals;

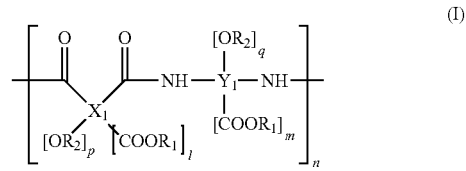

wherein $X_1$ is a di- to octa-valent organic group, $Y_1$ is a di- to octa-valent organic group, $R_1$ is a hydrogen atom or an organic group having 1 to 20 carbon atoms, $R_2$ is a hydrogen atom or a monovalent organic group, when plural $R_1$s or $R_2$s exist, the plural $R_1$s or $R_2$s may be the same or different, p and q are independently an integer of 0 to 4, l and m are independently an integer of 0 to 2, and n is an integer of 2 or more which indicates the number of the structural units;

(B) a solvent; and
(C) a compound shown by the following formula (II)

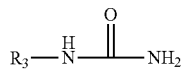
(II)

wherein $R_3$ is a monovalent organic group.

The resin composition of the invention has high resolution and can form a good shaped pattern. The hardened film produced from the resin composition of the invention can prevent melt of a relief pattern and reduce sublimation and generation of gas components during heating after the final heating step.

The polymer having an acidic functional group or a group derived therefrom at both of the terminals, which is the component (A) (hereinafter referred to simply as component (A)) has the structural unit shown by the formula (I), and the precursor thereof is generally a polymer having heat resistance. Due to component (A) has such a structure, properties of the film obtained from the resin composition of the invention can be improved.

Component (A) in the invention contains two amide bonds in one structural unit as shown in the structural unit of the formula (I). This structure is generally formed by the reaction of a carboxylic acid (di-, tri-, tetra- or higher valent-carboxylic acid), or an anhydride or a derivative thereof and a diamine.

Therefore, a di- to octa-valent organic group for $X_1$ in the formula (I) is an organic group which shows the partial structure other than the carboxy group forming an amide bond through the reaction with an amine and other acidic functional groups (for example, a carboxy group or a group formed by esterification thereof, and a phenolic hydroxy group or a group wherein a hydrogen thereof is substituted by a substituent) in the above-mentioned structure of the carboxylic acid. For example, it is an organic group corresponding to the structure other than a tetracarboxylic dianhydride or a carboxy group, an acid anhydride group and other acidic functional group of the dicarboxylic acid. In general, $X_1$ preferably contains an aromatic ring, and the carboxy group and other acidic functional group preferably bond to the aromatic ring directly.

The tetracarboxylic dianhydride includes pyromellitic dianhydride, 3,3',4,4'-biphenyltetracarboxylic dianhydride, 2,3,3',4'-biphenyltetracarboxylic dianhydride, 2,2',3,3'-biphenyltetracarboxylic dianhydride, 3,3',4,4'-benzophenonetetracarboxylic dianhydride, 2,2',3,3'-benzophenonetetracarboxylic dianhydride, 2,2-bis(3,4-dicarboxyphenyl)propane dianhydride, 2,2-bis(2,3-dicarboxyphenyl)propane dianhydride, 1,1-bis(3,4-dicarboxyphenyl)ethane dianhydride, 1,1-bis(2,3-dicarboxyphenyl)ethane dianhydride, bis(3,4-dicarboxyphenyl)methane dianhydride, bis(2,3-dicarboxyphenyl)methane dianhydride, bis(3,4-dicarboxyphenyl)sulfone dianhydride, bis(3,4-dicarboxyphenyl)ether dianhydride, 1,2,3,4-cyclopentanetetracarboxylic dianhydride, 2,2-bis(4-(4-aminophenoxy)phenyl)propane, 1,2,5,6-naphthalenetetracarboxylic dianhydride, 2,3,6,7-naphthalenetetracarboxylic dianhydride, 2,3,5,6-pyridinetetracarboxylic dianhydride, 3,4,9,10-perylenetetracarboxylic dianhydride, 3,3',4,4'-tetraphenylsilanetetracarboxylic dianhydride and 2,2-bis(3,4-dicarboxyphenyl)hexafluoropropane dianhydride. They are used alone or in combination of two or more kinds. Further, it is not limited to the above-mentioned ones.

Of the above-mentioned tetracarboxylic dianhydrides, pyromellitic dianhydride, 3,3',4,4'-biphenyltetracarboxylic dianhydride, 2,3,3',4'-biphenyltetracarboxylic dianhydride, 2,2',3,3'-biphenyltetracarboxylic dianhydride, 3,3',4,4'-benzophenonetetracarboxylic dianhydride, 2,2',3,3'-benzophenonetetracarboxylic dianhydride, bis(3,4-dicarboxyphenyl)ether dianhydride, 2,2-bis(3,4-dicarboxyphenyl)hexafluoropropane dianhydride and N-(trimellitic dianhydride)-2,2'-bis(3-amino-4-hydroxyphenyl)hexafluoropropane are preferable for obtaining good film properties with high heat resistance.

The dicarboxylic acid includes 3-fluoroisophthalic acid, 2-fluoroisophthalic acid, 3-fluorophthalic acid, 2-fluorophthalic acid, 2,4,5,6-tetrafluoroisophthalic acid, 3,4,5,6-tetrafluorophthalic acid, 4,4'-hexafluoroisopropylidenediphenyl-1,1'-dicarboxylic acid, perfluorosuberic acid, 2,2'-bis(trifluoromethyl)-4,4'-biphenylenedicarboxylic acid, terephthalic acid, isophthalic acid and 4,4'-oxydiphenyl-1,1'-dicarboxylic acid (4,4'-diphenylether dicarboxylic acid. They are used alone or in combination of two or more kinds. Further, it is not limited to the above-mentioned ones.

Of the above-mentioned dicarboxylic acids, terephthalic acid, isophthalic acid and 4,4'-oxydiphenyl-1,1'-dicarboxylic acid are preferable for obtaining good film properties with high heat resistance.

For the purpose of adjustment of the alkali solubility, the above-mentioned dicarboxylic acid may have an acidic functional group which exhibits alkali solubility.

The dicarboxylic acid having an acidic functional group includes N-(trimellitic anhydride)-2,2'-bis(3-amino-4-hydroxyphenyl)hexafluoropropane (i.e. a dicarboxylic acid structure in which the acid anhydride of trimellitic anhydride is added to one of nitrogen atoms of 2,2'-bis(3-amino-4-hydroxyphenyl)hexafluoropropane to form a dicarboxylic acid, and so forth), N-(trimellitic anhydride)-2,2'-bis(3-amino-4-hydroxyphenyl)propane, N-(trimellitic anhydride)-4,4'-diamino-3,3'-dihydroxybiphenyl, N-(trimellitic anhydride)-2,2'-bis(3-amino-4-hydroxyphenyl)sulfone, N-(trimellitic anhydride)-2,2'-bis(3-amino-4-hydroxyphenyl)ether, N-(trimellitic anhydride)-2,2'-bis(3-amino-4-hydroxyphenyl)propane, N-(trimellitic anhydride)-2,4-diaminophenol, N-(trimellitic anhydride)-2,5-diaminophenol and N-(trimellitic anhydride)-1,4-diamino-2,5-dihydroxybenzene. They are used alone or in combination of two or more kinds. Further, it is not limited to the above-mentioned ones.

Of the above-mentioned dicarboxylic acids having an acidic functional group, N-(trimellitic anhydride)-2,2'-bis(3-amino-4-hydroxyphenyl)hexafluoropropane, N-(trimellitic anhydride)-2,2'-bis(3-amino-4-hydroxyphenyl)propane, N-(trimellitic anhydride)-4,4'-diamino-3,3'-dihydroxybiphenyl, N-(trimellitic anhydride)-2,2'-bis(3-amino-4-hydroxyphenyl)sulfone, N-(trimellitic anhydride)-2,2'-bis(3-amino-4-hydroxyphenyl)ether and N-(trimellitic anhydride)-2,2'-bis(3-amino-4-hydroxyphenyl)propane are preferable for obtaining good film properties with high heat resistance.

Further, a tricarboxylic acid such as trimellitic acid or an anhydride thereof may be used.

The di- to octa-valent organic group for $Y_1$ in the formula (I) is an organic group which corresponds to the partial structure where from a diamine and/or a diamine having an acidic functional group, the two amino groups and acidic functional groups are removed, for example. In general, $Y_1$ preferably contains an aromatic ring, and the amino group and other acidic functional group preferably bond to the aromatic ring.

The above-mentioned diamine includes 4,4'-diaminodiphenyl ether, 4,4'-diaminodiphenyl methane, 4,4'-diaminodiphenyl sulfone, 4,4'-diaminodiphenyl sulfide, m-phenylenediamine, p-phenylenediamine, 1,5-naphthalenediamine, 2,6-naphthalenediamine, bis(4-aminophenoxyphenyl)sulfone, bis(3-aminophenoxyphenyl) sulfone, bis(4-aminophenoxy)biphenyl, bis[4-(4-aminophenoxy)phenyl]ether, 1,4-bis(4-aminophenoxy) benzene, 2,2'-dimethyl-4,4'-diaminobiphenyl, 2,2'-diethyl-4, 4'-diaminobiphenyl, 3,3'-dimethyl-4,4'-diaminobiphenyl, 3,3'-diethyl-4,4'-diaminobiphenyl, 2,2',3,3'-tetramethyl-4,4'-diaminobiphenyl, 2,2',3,3'-tetraethyl-4,4'-diaminobiphenyl, 2,2'-dimethoxy-4,4'-diaminobiphenyl, 3,3'-dimethoxy-4,4'-diaminobiphenyl, 2,2'-dihydroxy-4,4'-diaminobiphenyl, 3,3'-dihydroxy-4,4'-diaminobiphenyl and 2,2'-di(trifluoromethyl)-4,4'-diaminobiphenyl. They are used alone or in combination of two or more kinds. Further, it is not limited to the above-mentioned ones.

Of the above-mentioned diamines, 4,4'-diaminodiphenyl ether, m-phenylenediamine, p-phenylenediamine, bis(4-aminophenoxy)biphenyl, 2,2'-dimethyl-4,4'-diaminobiphenyl and 3,3'-dimethyl-4,4'-diaminobiphenyl are preferable for obtaining good film properties with high heat resistance.

For the purpose of adjustment of the alkali solubility, the above-mentioned diamine may have an acidic functional group which exhibits alkali solubility.

The diamines having an acidic functional group include ones having at least one carboxy group like the isomers thereof such as 2,4-diaminobenzoic acid, 3,5-diaminobenzoic acid, 3,3'-diaminobiphenyl-5,5'-dicarboxylic acid, 4,4'-diaminodiphenylether-5,5'-dicarboxylic acid, 4,4'-diaminodiphenylmethane-5,5'-dicarboxylic acid, 4,4'-diaminodiphenylsulfone-5,5'-dicarboxylic acid and 4,4'-diaminodiphenylsulfide-5,5'-dicarboxylic acid, and ones having a phenol group such as 4,4'-diamino-3,3'-dihydroxybiphenyl, 2,2'-bis(3-amino-4-hydroxyphenyl)propane, 2,2'-bis(3-amino-4-hydroxyphenyl)hexafluoropropane, oxybis(3-amino-4-hydroxyphenyl), bis(3-amino-4-hydroxyphenyl) sulfone, 2,4-diaminophenol, 1,4-diamino-2,5-dihydroxybenzene, N,N'-(4-aminophenylcarbonyl)-3,3'-dihydroxybiphenyl, N,N'-(3-aminophenylcarbonyl)-3,3'-dihydroxybiphenyl, N,N'-(4-aminophenylcarbonyl)2,2'-bis(3-amino-4-hydroxyphenyl)hexafluoropropane, N,N'-(3-aminophenylcarbonyl)2,2'-bis(3-amino-4-hydroxyphenyl) hexafluoropropane, N,N'-(4-aminophenylcarbonyl)2,2'-bis(3-amino-4-hydroxyphenyl)propane, N,N'-(3-aminophenylcarbonyl)2,2'-bis(3-amino-4-hydroxyphenyl) propane, N,N'-(4-aminophenylcarbonyl)-oxybis(3-amino-4-hydroxyphenyl), N,N'-(3-aminophenylcarbonyl)-oxybis(3-amino-4-hydroxyphenyl), N,N'-(4-aminophenylcarbonyl)-bis(3-amino-4-hydroxyphenyl)sulfone, N,N'-(3-aminophenylcarbonyl)-bis(3-amino-4-hydroxyphenyl) sulfone, N,N'-(4-aminophenylcarbonyl)-2,4-diaminophenol, N,N'-(3-aminophenylcarbonyl)-2,4-diaminophenol, N,N'-(4-aminophenylcarbonyl)-1,4-diamino-2,5-dihydroxybenzene and N,N'-(3-aminophenylcarbonyl)-1,4-diamino-2,5-dihydroxybenzene. They are used alone or in combination of two or more kinds. Further, it is not limited to the above-mentioned ones.

Of the above-mentioned diamines having an acidic functional group, 3,5-diaminobenzoic acid, and diamines having a phenol group such as 4,4'-diamino-3,3'-dihydroxybiphenyl, 2,2'-bis(3-amino-4-hydroxyphenyl)propane, 2,2'-bis(3-amino-4-hydroxyphenyl)hexafluoropropane, oxybis(3-amino-4-hydroxyphenyl), bis(3-amino-4-hydroxyphenyl) sulfone, 2,4-diaminophenol, 1,4-diamino-2,5-dihydroxybenzene, N,N'-(4-aminophenylcarbonyl)-3,3'-dihydroxybiphenyl, N,N'-(3-aminophenylcarbonyl)-3,3'-dihydroxybiphenyl, N,N'-(4-aminophenylcarbonyl)2,2'-bis(3-amino-4-hydroxyphenyl)hexafluoropropane, N,N'-(3-aminophenylcarbonyl)2,2'-bis(3-amino-4-hydroxyphenyl) hexafluoropropane, N,N'-(4-aminophenylcarbonyl)2,2'-bis(3-amino-4-hydroxyphenyl)propane, N,N'-(3-aminophenylcarbonyl)2,2'-bis(3-amino-4-hydroxyphenyl)propane, N,N'-(4-aminophenylcarbonyl)-oxybis(3-amino-4-hydroxyphenyl), N,N'-(3-aminophenylcarbonyl)-oxybis(3-amino-4-hydroxyphenyl), N,N'-(4-aminophenylcarbonyl)-bis(3-amino-4-hydroxyphenyl)sulfone and N,N'-(3-aminophenylcarbonyl)-bis(3-amino-4-hydroxyphenyl) sulfone are preferable for obtaining good alkali development property.

By introducing functional groups as the monovalent organic group other than a hydrogen atom for $R_1$ in component (A), control of the solubility at the time of development and/or patterning processing using a photo-reaction become possible. Further, by partially introducing the functional groups so that any hydrogen atoms for $R_1$ remain, alkali solubility can be controlled.

As a method of introducing functional groups as a monovalent organic group for $R_1$ in the formula (I), a method of introducing them through an ether bond or an ester bond may be mentioned. As the specific introducing method, a method of reacting a halogen compound or an acid halide compound which has $R_1$ as a substituent, with a group in which $R_1$ is a hydrogen atom, an addition reaction using a deacidification halogen reaction, an addition reaction with divinyl ether, and the like may be mentioned.

The organic group having 1 to 20 carbon atoms for $R_1$ in the formula (I) includes a methyl group, an ethyl group, a propyl group, an isopropyl group, a n-butyl group, a s-butyl group, a t-butyl group, a cyclopropyl group, a cyclobutyl group, a cyclopentyl group, a cyclohexyl group, a cyclohexylmethyl group, a cyclopropenyl group, a cyclobutenyl group, a cyclopentynyl group, a cyclohexenyl group, a norbornyl group, a norbornenyl group, an adamantyl group, a benzyl group, a p-nitrobenzyl group, a trifluoromethyl group, a methoxyethyl group, an ethoxyethyl group, a methoxymethyl group, an ethoxymethyl group, a methoxyethoxymethyl group, a benzoxymethyl group, an ethoxytetrahydropyranyl group, a tetrahydrofuranyl group, a 2-trimethylsilylethoxymethyl group, a trimethylsilyl group, a t-butyldimethylsilyl group, a 3-oxocyclohexyl group, a 9-fluorenylmethyl group, a phenyl group, a tolyl group, a xylyl group, a 9,10-dihydroanthranyl group, a trimethylphenyl group, a pentamethylphenyl group, a biphenylyl group, a terphenylyl group, a quaterphenylyl group, a dimethylbiphenylyl group, a naphthalenyl group, a methylnaphthalenyl group, a fluorenyl group, a fluorophenyl group, a fluorobiphenyl group, an isopropylidenebiphenylyl group, a tetrafluoroisopropylidenebiphenylyl group, a benzyl phenyl ether group, a diphenyl ether group, a methoxybiphenylyl group, a dimethoxybiphenylyl group, a methoxynaphthalenyl group, a dimethoxynaphthalenyl group and a nitrophenyl group. It is not limited to the above-mentioned ones.

From the view point of better solubility control, of the above-mentioned organic groups having 1 to 20 carbon atoms, organic groups having 1 to 15 carbon atoms are preferable.

The above-mentioned organic groups for $R_1$ may contain in the skeleton a hetero atom such as an oxygen atom, a sulfur atom, a nitrogen atom or a silicon atom, or an organic group such as ketone, ester, amide or alkylidene (including an organic group in which a hydrogen atom is substituted by a halogen atom such as a fluorine atom).

As the monovalent organic group for $R_2$ in the formula (I), the organic groups having 1 to 20 carbon atoms as exemplified in the explanation of $R_1$ may be mentioned.

Component (A) contains an acidic functional group or a group derived therefrom at both of the terminals. As the specific acidic functional groups, a carboxy group, a phenolic hydroxy group, etc. may be mentioned. Thus, specific examples of the acidic functional groups or the groups derived therefrom include the above-mentioned groups exemplified by —COOR$_1$ or —OR$_2$.

From the fact that excellent hardened resin properties can be obtained, component (A) may have preferably at the terminals any structure represented by the following formula (III) as an acidic functional group which is derived from an amino group or a group derived therefrom:

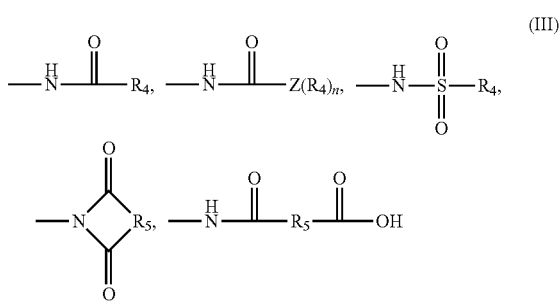

In the formulas, R$_4$ is a monovalent organic group and preferably an organic group having 1 to 20 carbon atoms.

Z is an oxygen atom, a sulfur atom or a nitrogen atom, and when Z is an oxygen atom or a sulfur atom, n is 1, and when Z is a nitrogen atom, n is 2.

R$_5$ is an aliphatic group or an aromatic group which has a linear, branched or cyclic structure.

The monovalent organic group for R$_4$ is the same as the organic group having 1 to 20 carbon atoms for R$_1$.

The aliphatic group for R$_5$ includes linear and branched alkylene groups, cycloalkylene groups such as a cyclopentylene group, a cyclohexylene group and a cyclooctylene group. These aliphatic groups may have a substituent. Further, they may contain a hetero atom such as an oxygen atom, a sulfur atom, a nitrogen atom or a silicon atom, or an organic group such as ketone, ester, amide or alkylidene (including a group in which a hydrogen atom is substituted by a halogen atom such as a fluorine atom).

The aromatic group for R$_5$ includes a phenylene group and a naphthalenylene group. These groups may have a substituent substituted on the aromatic group, and the substituent may contain a hetero atom such as an oxygen atom, a sulfur atom, a nitrogen atom or a silicon atom.

Further, the aromatic group for R$_5$ may be one in which two or more aromatic rings bond through a group such as a single bond, a hetero atom such as an oxygen atom, a sulfur atom, a nitrogen atom or a silicon atom, or a carbonyl bond, an ester bond, an amide bond or an alkylidene (including one in which a hydrogen atom is substituted by a halogen atom such as a fluorine atom).

The structure of R$_5$ can be obtained, for example, by the reaction of an acid anhydride having R$_5$ and an amine.

The above-mentioned acid anhydride includes succinic anhydride, glutaric anhydride, 2,2-dimethylglutaric anhydride, maleic anhydride, 1,2-cyclopentanedicarboxylic anhydride, 1,2-cyclohexanedicarboxylic anhydride, 5-norbornene-2,3-dicarboxylic anhydride, phthalic anhydride, 3-fluorophthalic anhydride, 4-fluorophthalic anhydride and 3,4,5,6-tetrafluorophthalic anhydride. It is not limited to the above-mentioned ones.

The molecular weight of component (A) is preferably in a range of 5,000 to 80,000 and more preferably in a range of 10,000 to 40,000, in the weight average molecular weight.

The weight average molecular weight can be obtained by converting the value measured through the gel-permeation chromatography method by using a standard polystyrene calibration curve.

Preferred examples of component (A) include polyimide precursors and polybenzoxazole precursors obtained by using a tetracarboxylic dianhydride, a dicarboxylic acid or a compound derived therefrom which has an acidic functional group (acid component), and a diamine or a compound derived therefrom which has an acidic functional group (amine component), as the main raw materials of the polymer; and copolymers thereof and mixtures thereof. Of these, the polyimide precursors and the polybenzoxazole precursors are more preferable. In general, these acidic functional groups are introduced for the purpose of making alkali development of the resultant polymer to be possible, therefore, a carboxy group and a phenolic hydroxy group may be mentioned as preferred examples.

Namely, the polyimide precursor as component (A) can be prepared by the polymerization of a tetracarboxylic dianhydride and a diamine and/or a diamine having an acidic functional group. In the same manner, the polybenzoxazole precursor as component (A) can be prepared by the polymerization of a dicarboxylic acid and/or a dicarboxylic acid having an acidic functional group which is the activated ester, and a diamine having a phenolic acid functional group (a phenolic hydroxy group) at the ortho-position relative to the amino group (dihydroxy diamine). A copolymer of the polybenzoxazole precursor as component (A) can be prepared by the copolymerization of a tetracarboxylic dianhydride, a dicarboxylic acid and/or a dicarboxylic acid having an acidic functional group which is the activated ester, and a diamine and/or a diamine having an acidic functional group.

In the preparation of component (A), as one method of introducing an acidic functional group at both of the terminals, the acid component is added in an amount larger than that of the amine component and polymerized at the time of preparation of the polymer or the copolymer. In this case, the molar ratio of the acid component:amine component is generally preferably 100:95 to 100:80.

Component (A) is preferably a polymer wherein in the formula (I), p is 0, q is 0 to 2, l is 0 to 2, and m is 0 to 2, for example, p is 0, q is 2, l is 0, m is 0, p is 0, q is 2, l is 2 and m is 0. Of these, a polyimide precursor having a carboxy group at both of the terminals, which is obtained by blending the acid component:amine component in a molar ratio of 100:95 to 100:80, followed by polymerization. A polyimide acid ester (which has a phenolic hydroxy group at the amine residue) wherein in the formula (I), R$_1$ is an alkyl group and R$_2$ is a hydrogen atom is particularly preferable.

In the synthesis of component (A), an equivalence ratio of a tetracarboxylic acid and/or a dicarboxylic acid which have an organic group X$_1$ in the formula (I) (acid component) and a diamino compound which has an organic group Y$_1$ (amine component) is preferably 0.6<X$_1$/Y$_1$<1.5. When the equivalence ratio of a tetracarboxylic acid and/or a dicarboxylic acid which have an organic group X$_1$ in the formula (I) and a diamino compound which has an organic group Y$_1$ is outside the above-mentioned range, the weight-average molecular weight becomes smaller and film properties may be deteriorated.

By varying the equivalence ratio within the above-mentioned range, both of the terminals of component (A) obtained can be made to be an amino group or a carboxy group.

Further, by introducing an acidic functional group or a group derived therefrom to the amino group or the carboxy group, both of the terminals of component (A) can be made to be various acidic functional groups or groups derived therefrom.

When the equivalence ratio of a tetracarboxylic acid and/or a dicarboxylic acid which have an organic group $X_1$ in the formula (I), and a diamine compound which has an organic group $Y_1$ is $0.6<X_1/Y_1<1$, both of the terminals of the polyimide precursor and/or polybenzoxazole precursor obtained are amino groups. In this case, an acidic functional group or a group derived therefrom is further introduced to the amino groups to obtain component (A) used in the invention.

As the method of making both of the terminals to be an acidic functional group or a group derived therefrom, a method in which the acid component is blended in an excessive amount of $1<X_1/Y_1<1.5$, and preferably $1.05<X_1/Y_1<1.25$ may be mentioned. In this case, both of the terminals of component (A) obtained are made to be carboxy groups. When they are carboxy groups, they may be as they are because they are acidic functional groups. However, they may be further substituted by other acidic functional groups or groups derived therefrom.

As a specific method of introducing functional groups to both of the terminals, a method wherein a monoamino compound which has a functional group or to which a functional group can be introduced are added at the time of synthesis of component (A) may be mentioned.

The above-mentioned monoamino compound includes aliphatic amines such as ethylamine, propylamine, isopropylamine, butylamine, isobutylamine, t-butylamine, diethylamine, dipropylamine, diisopropylamine, dibutylamine, cyclopropylamine, cyclobytylamine, cyclopentylamine, cyclohexylamine and cyclohexyl methyl amine; and aromatic amines such as aniline, o-toluidine, m-toluidine, p-toluidine, o-aminophenol, m-aminophenol and p-aminophenol. It is not limited to the above-mentioned ones. Of these, preferred are ones which terminals are made to be an acidic functional group or a group derived therefrom by an addition of a monoamino compound having an acidic functional group such as a phenolic hydroxy group, for example, o-aminophenol, m-aminophenol or p-aminophenol.

Solvent (B) contained in the resin composition of the invention (hereinafter often referred to simply as component (B)) is not particularly limited so long as it can dissolve components (A), (B) and the like, for example.

As component (B), polar solvents are preferable such as γ-butyrolactone, N-methyl-2-pyrrolidone, N-acetyl-2-pyrrolidone, N,N-dimethylacetamide, dimethyl sulfoxide, hexamethylphosphoric triamide, dimethylimidazolidinone and N-acetyl-ε-caprolactam.

In addition to the above-mentioned polar solvents, ketones, esters, lactones, ethers, halogenated hydrocarbons and hydrocarbons may be used as component (B).

Specifically, acetone, diethyl ketone, methyl ethyl ketone, methyl isobutyl ketone, cyclohexanone, methyl acetate, ethyl acetate, butyl acetate, diethyl oxalate, diethyl malonate, diethyl ether, ethylene glycol dimethyl ether, diethylene glycol dimethyl ether, propylene glycol monomethyl ether, propylene glycol monomethyl ether acetate, tetrahydrofuran, methylene chloride, 1,2-dichloroethane, 1,4-dichlorobutane, trichloroethane, chlorobenzene, o-dichlorobenzene, hexane, heptane, octane, benzene, toluene and xylene can be used. These organic solvents are used alone or in combination of two or more kinds.

The content of component (B) in the resin composition of the invention is normally 40 to 90 wt %. It is normally 60 to 1500 parts by weight relative to 100 parts by weight of component (A).

Component (C) contained in the resin composition of the invention is a compound shown by the following formula (II):

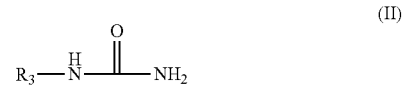

(II)

wherein $R_3$ is a monovalent organic group.

It is presumed that the compound reacts with the terminal groups of the above-mentioned acidic functional group or group derived therefrom in component (A). It is presumed that the excellent effects of the invention can be obtained by the reaction.

Preferably, $R_3$ in the formula (II) has a functional group causing self condensation.

As the functional group causing self condensation, an alkoxysilyl group, an ethenyl group, etc. can be given, and an alkoxysilyl group is preferable in view of prevention of melt. Here, the alkoxysilyl group denotes a group having a structure in which an alkoxy group bonds to a silicon atom, such as a monoalkoxy dialkylsilyl group, a dialkoxy monoalkylsilyl group and a trialkoxysilyl group.

Preferably, the functional group causing self condensation does not undergo self condensation until it is subject to the below-mentioned patterning production method.

The compound shown by the formula (II) wherein $R_3$ is an organic group having an alkoxysilyl group as a functional group includes ureidomethyl trimethoxysilane, ureidomethyl triethoxysilane, ureidomethyl tripropoxysilane, ureidomethyl tributoxysilane, ureidomethyl tripentoxysilane, 2-ureidoethyl trimethoxysilane, 2-ureidoethyl triethoxysilane, 2-ureidoethyl tripropoxysilane, 2-ureidoethyl tributoxysilane, 2-ureidoethyl tripentoxysilane, 1-ureidopropyl trimethoxysilane, 1-ureidopropyl triethoxysilane, 1-ureidopropyl tripropoxysilane, 1-ureidopropyl tributoxysilane, 1-ureidopropyl tripentoxysilane, 2-ureidopropyl trimethoxysilane, 2-ureidopropyl triethoxysilane, 2-ureidopropyl tripropoxysilane, 2-ureidopropyl tributoxysilane, 2-ureidopropyl tripentoxysilane, 3-ureidopropyl trimethoxysilane, 3-ureidopropyl triethoxysilane, 3-ureidopropyl tripropoxysilane, 3-ureidopropyl tributoxysilane, 3-ureidopropyl tripentoxysilane, 1-methyl-2-ureidoethyl trimethoxysilane, 1-methyl-2-ureidoethyl triethoxysilane, 1-methyl-2-ureidoethyl tripropoxysilane, 1-methyl-2-ureidoethyl tributoxysilane, 1-methyl-2-ureidoethyl tripentoxysilane, 4-ureidobutyl trimethoxysilane, 4-ureidobutyl triethoxysilane, 4-ureidobutyl tripropoxysilane, 4-ureidobutyl tributoxysilane, 4-ureidobutyl tripentoxysilane, 5-ureidopentyl trimethoxysilane, 5-ureidopentyltriethoxysilane, 5-ureidopentyltripropoxysilane, 5-ureidopentyltributoxysilane and 5-ureidopentyl tripentoxysilane. It is not limited to the above-mentioned ones.

The compound shown by the formula (II) wherein $R_3$ is an organic group having an ethenyl group as a functional group includes N-allylurea, penta-1-en-5-yl urea, penta-2-en-5-yl urea, penta-3-en-1-yl urea, penta-1-en-1-yl urea, bicyclo[2.2.1]hepta-5-en-2-ylmethyl urea, 2-(bicyclo[2.2.1]hepta-5-en-2-yl)eth-2-ylurea, 2-(bicyclo[2.2.1]hepta-5-en-2-yl)eth-1-yl urea, 1-(bicyclo[2.2.1]hepta-5-en-2-yl)propan-1-yl urea, 2-(bicyclo[2.2.1]hepta-5-en-2-yl)propan-1-yl urea, 3-(bicyclo[2.2.1]hepta-5-en-2-yl)propan-1-yl urea, 1-(bicyclo[2.2.1]hepta-5-en-2-yl)propan-2-yl urea and 2-(bicyclo[2.2.1]hepta-5-en-2-yl)propan-2-yl urea. It is not limited to the above-mentioned ones.

The monovalent organic group for $R_3$ may contain in the skeleton a hetero atom such as an oxygen atom, a sulfur atom, a nitrogen atom or a silicon atom, or an organic group such as ketone, ester, amide or alkylidene (including one wherein a hydrogen atom is substituted by a halogen atom such as a fluorine atom).

These components (C) can be used alone or in combination of two or more kinds.

The content of component (C) is usually 0.1 to 20 parts by weight and preferably 0.2 to 15 parts by weight, relative to 100 parts by weight of component (A). When the content of component (C) is less than 0.1 part by weight relative to 100 parts by weight of component (A), preventing effect against melt may deteriorate. On the other hand, when the content of component (C) exceeds 20 parts by weight relative to 100 parts by weight of component (A), no significant improvement in preventing effect against melt may be obtained.

Preferably, the resin composition of the invention comprising components (A), (B) and (C) further comprises (D) a compound which generates an acid by light (hereinafter often referred to simply as component (D)).

Component (D) is a photo-sensitive agent having a function of generating an acid and increasing solubility of a light-irradiated part to an alkali aqueous solution. An addition of component (D) to the resin composition of the invention can make the resin composition of the invention to be a photo-sensitive resin composition.

Component (D) may be a compound which generates an acid by light, and it includes o-quinonediazide compounds, aryl diazonium salts, diaryl iodonium salts and triaryl sulfonium salts. Preferred are o-quinonediazide compounds.

The o-quinonediazide compounds can be obtained, for example, by the condensation reaction of o-quinonediazidesulfonyl chlorides with hydroxy compounds, amino compounds or the like in the presence of a hydrogen chloride remover.

The o-quinonediazide sulfonyl chlorides include benzoquinone-1,2-diazide-4-sulfonyl chloride, naphthoquinone-1,2-diazide-5-sulfonyl chloride and naphthoquinone-1,2-diazide-4-sulfonyl chloride.

As the compounds to be reacted with the o-quinonediazide sulfonyl chlorides, hydroxy compounds are preferable in view of photo-sensitivity.

The hydroxy compounds include hydroquinone, resorcinol, pyrogallol, bisphenol A, bis(2-hydroxyphenyl)methane, bis(4-hydroxyphenyl)methane, 2-hydroxyphenyl-4'-hydroxyphenylmethane, 2,2-bis(4-hydroxyphenyl)hexafluoropropane, 2,3,4-trihydroxybenzophenone, 2,3,4,4'-tetrahydroxybenzophenone, 2,2',4,4'-tetrahydroxybenzophenone, 2,3,4,2',3'-pentahydroxybenzophenone, 2,3,4,3',4',5'-hexahydroxybenzophenone, bis(2,3,4-trihydroxyphenyl)methane, bis(2,3,4-trihydroxyphenyl)propane, 2-(4-hydroxyphenyl)-2-[4-[1,1-bis(4-hydroxyphenyl)ethyl]phenyl]propane, 4b,5,9b,10-tetrahydro-1,3,6,8-tetrahydroxy-5,10-dimethylindeno[2,1-a]indene, tris(4-hydroxyphenyl)methane and 1,1,1-tris(4-hydroxyphenyl)ethane. It is not limited to the above-mentioned ones.

The aryl diazonium salts, diaryl iodonium salts and triaryl sulfonium salts, which are component (D), include benzene diazonium p-toluenesulfonate, diphenyl iodonium 9,10-dimethoxyanthracene-2-sulfonate, tris(4-t-butylphenyl)sulfonium trifluoromethane sulfonate, N-trifluoromethanesulfonyl naphthalimide, p-nitrobenzyl-9,10-dimethoxyanthracene-2-sulfonate and 4-methoxy-α-[[[(4-methylphenyl)sulfonyl]oxy]imino]benzene acetonitrile. They are not limited to the above-mentioned ones.

The component (D) may be used alone or in combination of two or more kinds.

The content of component (D) is normally 0.1 to 40 parts by weight and more preferably 1 to 20 parts by weight, relative to 100 parts by weight of component (A). When the content of component (D) is less than 0.1 part by weight relative to 100 parts by weight of component (A), the effect of component (D) as the photo-sensitive agent may not be found sufficiently. On the other hand, when the content of component (D) is more than 40 parts by weight relative to 100 parts by weight of component (A), when a resin film formed of the composition of the invention is exposed to light, the exposure may not be conducted sufficiently enough to allow the bottom of the resin film to be exposed.

The composition of the invention may comprise, in addition to components (A) to (D), a silane coupling agent as an agent for increasing adhesiveness to a silicon substrate (provided that the above-mentioned component (C) is excluded).

As the silane coupling agent, alkoxysilanes are preferable in view of the reactivity.

The alkoxysilanes include vinyltrimethoxysilane, N-(2-aminoethyl)-3-aminopropylmethyltrimethoxysilane, 3-aminopropyltrimethoxysilane, N-methyl-3-aminopropyltrimethoxysilane, 3-glycidoxypropyltrimethoxysilane, 2-(3,4-epoxycyclohexyl)ethyltrimethoxysilane, 3-methacryloxypropyltrimethoxysilane, 3-mercaptopropyltrimethoxysilane, N-(1,3-dimethylbutylidene)-3-(triethoxysilyl)-1-propaneamine, N,N-bis(3-(trimethoxysilyl)propyl)ethylenediamine, N-(3-trimethoxysilylpropyl)pyrrole, N-(3-triethoxysilylpropyl)-t-butylcarbamate, N-phenyl-3-aminopropyltrimethoxysilane, bis(2-hydroxyethyl)-3-aminopropyltriethoxysilane, 3-isocyanatopropyltriethoxysilane and (furfuryloxymethyl)triethoxysilane. It is not limited to the above-mentioned ones.

Also, adhesiveness to a silicon substrate can be imparted to the resin composition of the invention by modifying part of $Y_1$ in the formula (I) for component (A) to an organic group derived from diaminosiloxane.

The composition of the invention may contain a dissolution inhibitor, a stabilizer, a surfactant or the like for any purpose. Further, the composition of the invention may contain a dissolution accelerator for the purpose of increasing dissolution contrast.

As the dissolution accelerator, compounds having an acidic functional group can be mentioned. As the acidic functional group, a phenolic hydroxy group, a carboxy group and a sulfonyl group are preferable.

The dissolution accelerator includes bis(2-hydroxyphenyl)methane, bis(4-hydroxyphenyl)methane, 2-hydroxyphenyl-4'-hydroxyphenyl methane, bis(2-hydroxy-4-methyl)methane, 4,4'-dihydroxydiphenyl ether, 2,2-bis(4-hydroxy-3-methylphenyl)propane, 4,4-(1-phenylethylidene)bisphenol, 5,5-(1-methylethylidene)bis(1,1-(biphenyl)-2-ol), tris(4-hydroxyphenyl)methane, 1,1,1-tris(4-hydroxyphenyl)ethane, 2,6-bis((2-hydroxy-5-methylphenyl)methyl)-4-methylphenol, 4,4-[1-[4-[1-(4-hydroxyphenyl)-1-methylethyl]phenyl]ethylidene]bisphenol, 4,4'-dihydroxyphenyl diphenylsulfone, 2-hydroxy-5-methyl-1,3-benzenedimethylol, 3,3-methylenebis(2-hydroxy-5-methylbenzenemethanol), bis[4-hydroxy-3,5-bis(hydroxymethyl)]methane, 2,2-bis[4-hydroxy-3,5-bis(hydroxymethyl)]propane, 2,2-bis[4-hydroxy-3,5-bis(hydroxymethyl)]hexafluoropropane, salicylic acid, malonic acid, methylmalonic acid, dimethylmalonic acid, butylmalonic acid, succinic acid, glutaric acid, 2,2-dimethylglutaric acid, adipic acid, itaconic acid, maleic acid, tetrafluoromaleic acid, diglycolic acid, 1,1-cyclobutanedicarboxylic acid, 1,2-cyclopentanedicarboxlic acid, 3,3-tetramethyleneglutalic acid, camphoric acid, 1,2-cyclohexanedicarboxylic acid, 1,3-cyclohexanedicarboxylic acid, 1,4-cyclohexanedicarboxylic acid, 1,3-adamantanedicarboxylic acid, 5-norbornene-2,3-dicarboxylic acid, 1,2-phenylenediacetic acid, 1,3-phenylenediacetic acid, 1,4-phenylenediacetic acid, perfluorosuberic acid, 2-fluoroisophthalic acid, 4-fluoroisophthalic acid, 5-fluoroisophthalic acid, 3-fluorophthalic acid, 4-fluorophthalic acid, 2,4,5,6-tetrafluoroisophthalic acid, 3,4,5,6-tetrafluorophthalic acid, 4,4'-hexafluoroisopropylidenephenyldiphenyldicarboxylic acid, 2,2'-bis(trifluoromethyl)-4,4'-biphenylenedicarboxylic acid, terephthalic acid, isophthalic acid, 4,4'-oxyphenyldiphenyldicarboxylic acid, 5-nitroisophthalic acid, 1,4-naphthalenedicarboxylic acid, 2,6-naphthalenedicarboxylic acid, 4,4-biphenyldicarboxylic acid and 4-hydroxybenzenesulfone acid. It is not limited to the above-mentioned ones. such a dissolution accelerator is used alone or in combination of two or more kinds.

The resin composition of the invention may comprise components (A) to (C) in an amount of 70 wt % or more, 80 wt % or more, 90 wt % or more or 100 wt %. In addition to these components, the composition of the invention can contain substances which do not substantially impair novel and essential properties of the invention, such as the above-mentioned component (D).

By applying the resin composition of the invention, a patterned hardened film can be formed.

In particular, the hardened film obtained from the resin composition of the invention can be prevented from occurrence of melt at the time of the final heating step. Further, sublimation of a cross-linking component and generation of gas component can be controlled even during heating after the final heating step.

The method of producing a patterned hardened film of the invention comprises steps of: applying the resin composition of the invention on a supporting substrate, followed by drying to form a resin film; exposing the resin film to light to have a prescribed pattern; developing the resin film after exposure with an alkaline aqueous solution to obtain a patterned resin film; and heating the patterned resin film.

The supporting substrate to which the resin composition of the invention is applied includes silicon wafers, metal substrates and ceramics substrates. The applying method includes dip coating methods, spray methods, screen printing methods and roll-coating methods.

By adequately drying with heat the resin composition of the invention coated on a supporting substrate, a resin film having no tackiness can be obtained.

When the resin composition of the invention to be used is a resin composition containing no component (D), prior to the light exposure of the resin film, by applying a photoresist on the resin film and irradiating an active light or actinic ray through a mask with a desired pattern, the resin film can be exposed to light.

When the resin composition of the invention to be used is a positive-type photo-sensitive resin composition containing component (D), light exposure can be carried out without application of the photoresist.

The active rays and actinic rays include contact/proximity exposures using very high-pressure mercury arc lamp, mirror projection exposures, i-line steppers, g-line steppers, and other ultraviolet ray and visible light sources, X-ray and electron beams.

After exposure, a post exposure bake (PEB) treatment may be conducted, if necessary.

By dissolving and removing the exposed portions of the resin film with an alkali aqueous solution, a desired positive pattern (patterned resin film) can be obtained.

As the alkali aqueous solution of a developing solution, aqueous solutions of alkali metal hydroxides such as potassium hydroxide and sodium hydroxide; quaternary ammonium hydroxides such as tetramethyl ammonium hydroxide, tetraethyl ammonium hydroxide and choline; amine aqueous solutions such as ethanolamine, propylamine and ethylenediamine, etc. can be used.

After development, rinsing may be conducted using water or a poor solvent, if necessary.

The rinse solution to be used includes methanol, ethanol, isopropyl alcohol, benzene, toluene, xylene, methyl cellosolve and water.

When the resin composition to be used is a resin composition containing no component (D), by removing the photoresist and heating the pattern obtained to remove the solvent, or the solvent and the photo-sensitive agent, a stable high heat resistant pattern can be obtained. Also, when the resin composition of the invention to be used is a positive-type photo-sensitive resin composition, by heating the pattern obtained to remove the solvent, or the solvent and the photo-sensitive agent, a stable high heat resistant pattern can be obtained.

The pattern is heated preferably at a temperature of 150 to 500° C., and more preferably at a temperature of 200 to 400° C.

When the heating temperature is lower than 150° C., mechanical properties and thermal properties of the film may be deteriorated. On the other hand, when the heating temperature is higher than 500° C., mechanical properties and thermal properties of the film may be deteriorated.

The pattern is heated preferably for 0.05 to 10 hours.

When the heating time is less than 0.05 hour, mechanical properties and thermal properties of the film may be deteriorated. On the other hand, when the heating time excesses 10 hours, mechanical properties and thermal properties of the film may be deteriorated.

The patterned hardened film formed from the resin composition of the invention can be used for electronic parts such as semi-conductor devices and multilayer wiring boards. Specifically, it can be used for a surface protection film layer or an interlayer insulating film layer in a semi-conductor device, an interlayer insulating film layer in a multilayer wiring board and the like.

In particular, the patterned hardened film formed from the resin composition of the invention has good shape and adhesiveness and excellent heat resistance. Therefore, the electronic part of the invention, which has the patterned hardened film, is very reliable.

The electronic part of the invention is not limited so long as it has a surface protection film and/or an interlayer insulating film formed from the resin composition of the invention, and it can have various structures. The electronic part includes various kinds of electronic devices such as semi-conductor devices, multi-layer wiring boards and suspensions for a hard disk drive.

The method for producing a patterned hardened film of the invention and the electronic part having the patterned hardened film of the invention will be explained with reference to the drawings which show the production process of the semi-conductor device having the patterned hardened film as one example.

FIGS. 1 to 5 are schematic cross-sectional views which explain the production process of the semi-conductor device, and show a series of steps from first to fifth steps.

In FIGS. 1 to 5, a semi-conductor substrate 1 such as a Si substrate, which has a circuit element (not shown), are coated with a protection film 2 such as a silicon oxide film, except for a predetermined portion of the circuit element, and a first conductor layer 3 is formed on the exposed portion of the circuit element. On the semi-conductor substrate 1, an interlayer insulating film layer 4 is formed by a spin coating method (first step, FIG. 1).

The interlayer insulating film layer 4 can be formed using the resin composition of the invention.

Next, a photo-sensitive resin layer 5 such as a chlorinated rubber type, a phenol novolak type or the like is formed as a mask on the interlayer insulating film layer 4 by a spin coating method. A window 6A is formed by a known photo-etching technique such that a predetermined portion of the interlayer insulating film layer 4 is exposed (second step, FIG. 2).

The interlayer insulating film layer 4 exposed through the window 6A can be selectively etched by a dry etching technique using a gas such as oxygen or carbon tetrafluoride, to open a window 6B. Then, an etching solution, which does not erode the first conductor layer 3 exposed through the window 6B, erodes only the photo-sensitive resin layer 5 to completely remove the photo-sensitive resin layer 5 (third step, FIG. 3)

Figure 4:
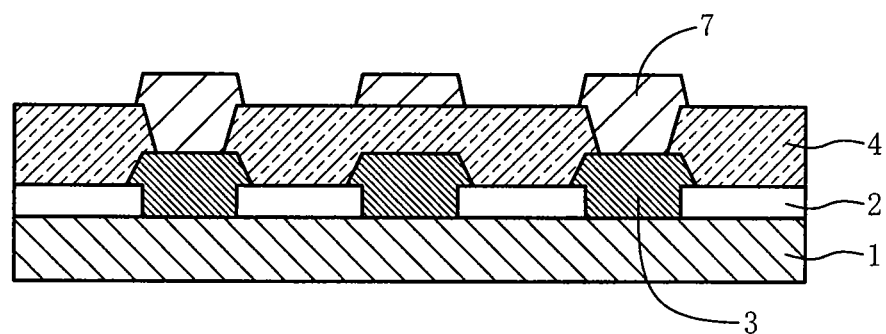
FIG. 4 is a schematic cross-sectional view which explains a production process of a semi-conductor device having a multilayer wiring structure according to one embodiment of the invention, which shows the fourth step.

By using a known photo-etching technique, a second conductor layer 7 is formed, and electrical connection with the first conductive layer 3 is completely formed (fourth step, FIG. 4). When forming a three- or more-multilayer wiring structure, each layer can be formed by repeating the above-mentioned steps.

Figure 5:
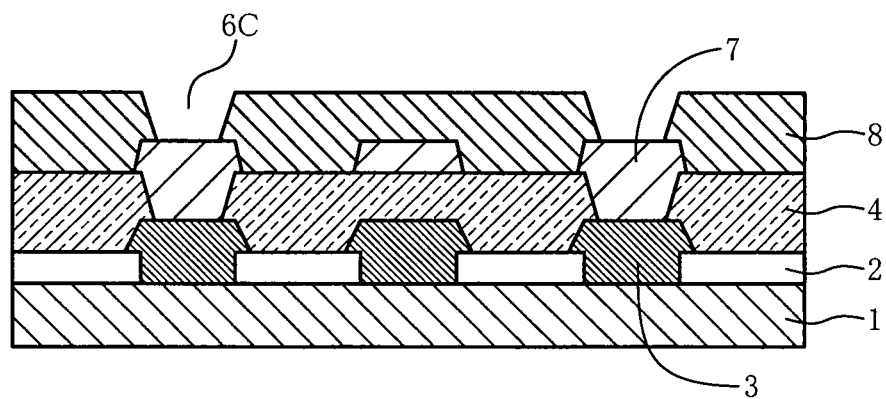
FIG. 5 is a schematic cross-sectional view which explains a production process of a semi-conductor device having a multilayer wiring structure according to one embodiment of the invention, which shows the fifth step.

Next, a surface protection film 8 is formed. In FIG. 5, the resin composition is applied by a spin coating method, dried and exposed through a mask having a pattern for forming a window 6C at a predetermined portion, followed by development with an alkali aqueous solution, to form a patterned resin film 8. Subsequently, the patterned resin film is heated to give a patterned hardened film made of a photo-sensitive resin as the surface protection film layer 8 (fifth step, FIG. 5).

The surface protection film layer (patterned hardened film) 8 protects the conductive layers from external stress, an α-ray, etc., and the resulting semi-conductor device is excellent in reliability.

EXAMPLES

Now, the invention will be concretely explained with reference to examples and comparative examples. The invention is not limited to the following examples.

Synthesis Example 1

In a flask which was an airtight reaction container equipped with a stirrer, a temperature gauge and a nitrogen introductory tube, 100 g of dried N-methylpyrrolidone and 26.6 g (0.09 mol) of 4,4'-diphenyl ether dicarboxylic acid dichloride were placed and dissolved with stirring to obtain a solution A-1.

Subsequently, in another airtight reaction container equipped with a stirrer, a temperature gauge and a nitrogen introductory tube, 105 g of dried N-methylpyrrolidone, 2.18 g (0.02 mol) of m-aminophenol (for forming terminals of a polymer) and 20.7 g (0.08 mol) of 2,2'-bis(3-amino-4-hydroxyphenyl)propane were placed and dissolved with stirring. The solution was cooled to 0° C., and the previously obtained reaction solution A-1 was dropwise added to the solution over 30 minutes, followed by stirring at room temperature for 30 minutes. The reaction mixture was treated with 2.0 litters of ion exchange water with vigorous stirring. Precipitated solids were washed with ion exchange water, dried under suction on a filtration filter, and further dried under reduced pressure to obtain a polymer P-1 having a phenolic hydroxy group at both of the terminals. The resultant polymer P-1 had a water content of 0.7 wt %, a weight-average molecular weight of 23,000 and a dispersity of 1.7.

Synthesis Example 2

In an airtight reaction container equipped with a stirrer, a temperature gauge and a nitrogen introductory tube, 100 g of dried N-methylpyrrolidone and 14.8 g (0.2 mol) of n-butanol were placed, and 31.0 g (0.1 mol) of bis(3,4-dicarboxyphenyl)ether dianhydride was added and stirred at a temperature of 70° C. for 24 hours to obtain an esterified substance. The solution was cooled to 0° C., and 23.8 g (0.2 mol) of thionyl chloride was dropwise added thereto, followed by stirring for 30 minutes to obtain a reaction solution A-2.

Subsequently, in another airtight reaction container equipped with a stirrer, a temperature gauge and a nitrogen introductory tube, 100 g of dried N-methylpyrrolidone, 33.0 g (0.09 mol) of 2,2'-bis(3-amino-4-hydroxyphenyl)hexafluoropropane and 15.82 g (0.2 mol) of pyridine were placed and dissolved with stirring. The solution was cooled to 0° C., and the previously obtained reaction solution A-2 was dropwise added thereto over 30 minutes, followed by stirring at room temperature for 30 minutes. The reaction mixture was treated with 2.0 litters of ion exchange water with vigorous stirring. Precipitated solids were washed with ion exchange water, dried under suction on a filtration filter and dried under reduced pressure until the water content reached less than 1.0 wt % to obtain a polymer P-2 having carboxy groups at both of the terminals. The resultant polymer P-2 had a weight-average molecular weight of 24,100 and a dispersity of 1.69.

Example 1

In a three-necked flask equipped with a stirrer, a temperature gauge and a nitrogen introductory tube, 10 g of the polymer P-1 prepared in Synthesis Example 1 and 15 g of γ-butyrolactone were placed and mixed, and dissolved with stirring. 1.50 g of a compound (o-quinonediazide 1) obtained by reacting 2-(4-hydroxyphenyl)-2-[4-[1,1-bis(4-hydroxyphenyl)ethyl]phenyl]propane and naphthoquinone-1,2-diazide-4-sulfonyl chloride in a molar ratio of 1/2.5, 0.80 g of 3-ureidopropyl trimethoxysilane and 0.20 g of bis(2-hydroxyethyl)-3-aminopropyl triethoxysilane (substituted triethoxysilane) were further added thereto. The mixture was dissolved with stirring for whole day and night, followed by filtration to obtain a solution of a positive type photo-sensitive resin composition.

The positive type photo-sensitive resin composition solution thus obtained was spin coated on a 5-inches silicone wafer, followed by drying to form a coated film having a thickness of 10.0±1.0 μm. Then, the coated film was exposed to light at a light exposure of 200 to 1000 mJ/cm² through a pattern mask by using an i-line stepper. The coated film was left to stand in a light-shielding box for one hour, then, subjected to a paddle development with a 2.38% tetramethyl ammonium hydroxide aqueous solution. The resolution reached up to 5 μm (minimum opening size) at a light exposure of 580 mJ/cm², and thus good relief pattern was obtained. When measured the size of an opening pattern at 800 mJ/cm², it was found to be 5.35 μm.

The wafer on which the relief pattern thus obtained was provided was heated on a hot plate at a temperature of 200° C. for 3 minutes under nitrogen atmosphere, then heated at 260° C. for 3 minutes and further heated at 350° C. for 7 minutes to obtain a hardened film having a thickness of 7 μm. When measured the size of an opening pattern of the resultant hardened film at 800 mJ/cm², it was found to be 5.02 μm, which was hardly changed in size.

Example 2

A positive type photo-sensitive resin composition solution was prepared in the same manner as in Example 1 except that the polymer P-2 was used in place of the polymer P-1, and 1.50 g of a compound (o-quinonediazide 2) obtained by reacting 2-(4-hydroxyphenyl)-2-[4-[1,1-bis(4-hydroxyphenyl)ethyl]phenyl]propane and naphthoquinone-1,2-diazide-4-sulfonyl chloride in a molar ratio of 1/2.5 was used in place of the compound obtained by reacting 2-(4-hydroxyphenyl)-2-[4-[1,1-bis(4-hydroxyphenyl)ethyl]phenyl]propane and naphthoquinone-1,2-diazide-4-sulfonyl chloride in a molar ratio of 1/2.5.

A relief pattern was prepared in the same manner as in Example 1 except that the positive type photo-sensitive resin composition solution was used and a light exposure was changed to 800 mJ/cm². As a result, a good opening pattern was obtained at a light exposure of 800 mJ/cm² and the size of the opening pattern was 5.24 μm. Also, a wafer on which the relief pattern was provided was treated with heat in the same manner as in Example 1, to obtain a hardened film. The size of an opening pattern of the resultant hardened film was 5.19 μm and the size was hardly changed.

Example 3

A positive type photo-sensitive resin composition solution was prepared in the same manner as in Example 2 except that the amount of 3-ureidopropyltrimethoxysilane was changed to 0.40 g.

A relief pattern was prepared with the positive type photo-sensitive resin composition solution in the same manner as in Example 2. As a result, a good opening pattern was obtained at a light exposure of 800 mJ/cm², and the size of the opening pattern was 5.23 μm. Also, in the same manner as in Example 1, a wafer on which the relief pattern was provided was treated with heat to obtain a hardened film. The size of an opening pattern of the resultant hardened film was 5.14 μm and hardly changed in size.

Comparative Example 1

A resin composition was prepared in the same manner as in Example 2 except that 3-ureidopropyltrimethoxysilane was added, and a relief pattern was prepared. As a result, a good opening pattern was obtained at a light exposure of 800 mJ/cm², and the size of the opening pattern was 5.32 μm. Also, a wafer on which the relief pattern was provided was treated with heat in the same manner as in Example 1 to obtain a hardened film. The resultant opening pattern of the hardened film was melted so that the opening pattern disappeared and the size thereof could not be measured.

Comparative Example 2

A resin composition was prepared in the same manner as in Example 1 except that 0.80 g of phenyltrimethoxysilane was used in place of 3-ureidopropyltrimethoxysilane, and a relief pattern was prepared. As a result, a good opening pattern was obtained at a light exposure of 500 mJ/cm², and the size of the opening pattern was 5.33 μm. Also, a wafer on which the relief pattern was provided was treated with heat in the same manner as in Example 1, to obtain a hardened film. The resultant opening pattern of the hardened film melted so that the opening pattern disappeared and the size thereof could not be measured.

Combinations of the components (A) and (C) in the resin compositions of Examples 1 to 3, and Comparative Examples 1 and 2, and sizes before and after hardening are shown in Table 1. In Examples of the invention, the size of the opening hardly changed between before and after hardening, and melt was prevented, while in both Comparative Examples, the opening pattern disappeared by melt. In the invention, it is understood that the effect is particularly good in Examples 2 and 3 using a polyimide precursor in which both of the terminals become a carboxy group due to an excessive acid component (a polyamide acid ester has a phenolic hydroxy group at an amine component residue).

TABLE 1

| | Component (A) | | Component (B) | | Component (C) | | Component (D) | |
|---|---|---|---|---|---|---|---|---|
| | Component name | Amount [g] | Component name | Amount [g] | Component name | Amount [g] | Component name | Amount [g] |
| Ex. 1 | P-1 | 10 | γ-butyrolactone | 15 | 3-ureido propyl tri-methoxy-silane | 0.8 | o-quinone-diazide 1 | 1.5 |
| Ex. 2 | P-2 | 10 | γ-butyrolactone | 15 | 3-ureido propyl tri-methoxy-silane | 0.8 | o-quinone-diazide 2 | 1.5 |
| Ex. 3 | P-2 | 10 | γ-butyrolactone | 15 | 3-ureido propyl tri-methoxy-silane | 0.4 | o-quinone-diazide 2 | 1.5 |
| Comp. Ex. 1 | P-2 | 10 | γ-butyrolactone | 15 | — | — | o-quinone-diazide 2 | 1.5 |
| Comp. Ex. 2 | P-1 | 10 | γ-butyrolactone | 15 | — | — | o-quinone-diazide 1 | 1.5 |

| | Other component | | Other component | | Opening size | |
|---|---|---|---|---|---|---|
| | Component name | Amount [g] | Component name | Amount [g] | Before hardening [μm] | After hardening [μm] |
| Ex. 1 | Substituted tri-ethoxy-silane | 0.2 | — | — | 5.35 | 5.02 |

TABLE 1-continued

| | | | | | | |
|---|---|---|---|---|---|---|
| Ex. 2 | Substituted tri-ethoxy-silane | 0.2 | — | — | 5.24 | 5.19 |
| Ex. 3 | Substituted tri-ethoxy-silane | 0.2 | — | — | 5.23 | 5.14 |
| Comp. Ex. 1 | Substituted tri-ethoxy-silane | 0.2 | — | — | 5.32 | — |
| Comp. Ex. 2 | Substituted tri-ethoxy-silane | 0.2 | Phenyl tri-methoxy-silane | 0.8 | 5.33 | — |

INDUSTRIAL APPLICABILITY

The resin composition of the invention is excellent in resistance to melt so that a relief pattern having a good shape can be obtained. The hardened film pattern prepared from the resin composition of the invention is excellent in reliability, and is particularly suitable for production of electronic parts.

Although some exemplary embodiments and/or examples of the invention have been described in detail above, those skilled in the art would readily appreciate that many modifications are possible in the exemplary embodiments and/or examples without materially departing from the novel teachings and advantages of this invention. Accordingly, all such modifications are intended to be included within the scope of this invention.

The documents described in the specification are incorporated herein by reference in their entirely.

The invention claimed is:

1. A resin composition for an insulating film or a surface protection film of an electronic part, the resin composition comprising:

(A) a polymer that has a structural unit shown by the following formula (I),

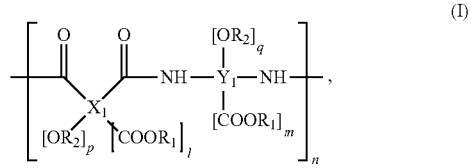

wherein $X_1$ is a di- to octa-valent organic group, $Y_1$ is a di- to octa-valent organic group, $R_1$ is a hydrogen atom or an organic group having 1 to 20 carbon atoms, $R_2$ is a hydrogen atom, and when plural $R_1$s or $R_2$s exist, the plural $R_1$s or $R_2$s may be the same or different, p and q are independently an integer of 0 to 4, l and m are independently an integer of 0 to 2, and n is an integer of 2 or more that indicates the number of the structural units, and the polymer has an acidic functional group at both of the terminals, wherein the acidic functional group is —COOR$_{10}$ or —OR$_{20}$, wherein R$_{10}$ is a hydrogen atom or an organic group having 1 to 20 carbon atoms, wherein R$_{20}$ is a hydrogen atom or a monovalent organic group or any of structures represented by the following formula (III),

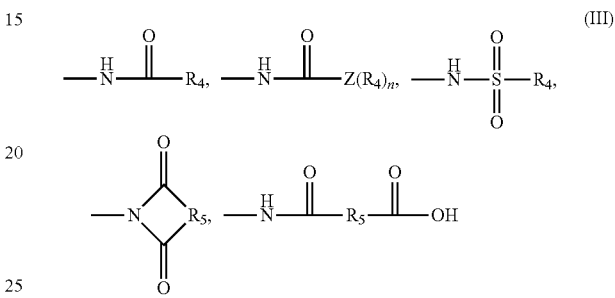

wherein $R_4$ is a monovalent organic group,
wherein Z is an oxygen atom, a sulfur atom or a nitrogen atom, and when Z is an oxygen atom or a sulfur atom, n is 1, and when Z is a nitrogen atom, n is 2,
wherein $R_5$ is an aliphatic group or an aromatic group which has a linear, branched or cyclic structure;

(B) a solvent; and (C) a compound shown by the following formula (II),

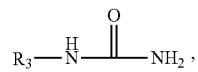

wherein $R_3$ is a monovalent organic group.

2. The resin composition according to claim 1, further comprising:

(D) a compound that generates an acid by light.

3. The resin composition according to claim 2, wherein the component (D) is an o-quinonediazide compound.

4. The resin composition according to claim 1, wherein $R_3$ in the formula (II) is a monovalent organic group containing an alkoxysilyl group or an ethenyl group.

5. The resin composition according to claim 1, wherein the component (A) is a polyimide precursor or a polybenzoxazole precursor.

6. The resin composition according to claim 1, wherein the component (A) is a polyimide precursor, wherein in the formula (I), p is 0, q is 2, l is 2 and m is 0, and both of the terminals are a carboxy group or a phenolic hydroxy group.

7. The resin composition according to claim 1, wherein the component (A) is a polybenzoxazole precursor, wherein in the formula (I), p is 0, q is 2, l is 0 and m is 0, and both of the terminals are a carboxy group or a phenolic hydroxy group.

8. A method of producing a patterned hardened film comprising the steps of:

applying the resin composition according to claim 1 on a supporting substrate, followed by drying to form a resin film;

exposing the resin film to light to have a prescribed pattern;
developing the resin film after the exposure with an alkaline aqueous solution to obtain a patterned resin film; and
heating the patterned resin film.

9. A hardened film obtained by hardening the resin composition according to claim 1.

10. An electronic part comprising the hardened film according to claim 9 as an insulating film or as a surface protection film.

11. The resin composition according to claim 1, wherein the acidic functional group at both of the terminals of polymer (A) is any of structures represented by the following formula (III),

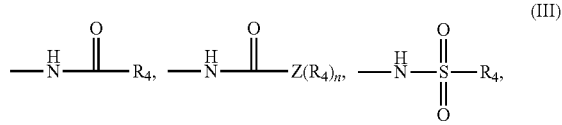
(III)

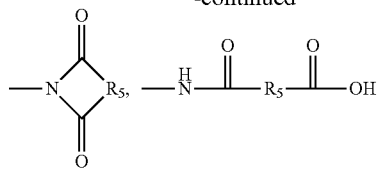
-continued wherein $R_4$ is a monovalent organic group, wherein Z is an oxygen atom, a sulfur atom or a nitrogen atom, and when Z is an oxygen atom or a sulfur atom, n is 1, and when Z is a nitrogen atom, n is 2, and wherein $R_5$ is an aliphatic group or an aromatic group having a linear, branched or cyclic structure.

12. The resin composition according to claim 1, wherein the acidic functional group at both of the terminals of polymer (A) is —COOR$_{10}$, wherein $R_{10}$ is a hydrogen atom or an organic group having 1 to 20 carbon atoms.

* * * * *